(12) United States Patent
Chen

(10) Patent No.: US 7,063,538 B2
(45) Date of Patent: Jun. 20, 2006

(54) MEMORY CARD STRUCTURE

(75) Inventor: Chien-Yuan Chen, Banchiau (TW)

(73) Assignee: Power Digital Card Co., Ltd., Taipei (TW)

( * ) Notice: Subject to any disclaimer, the term of this patent is extended or adjusted under 35 U.S.C. 154(b) by 0 days.

(21) Appl. No.: 10/986,331

(22) Filed: Nov. 12, 2004

(65) Prior Publication Data

US 2006/0105592 A1    May 18, 2006

(51) Int. Cl.
*H01R 12/00* (2006.01)

(52) U.S. Cl. .................................................. 439/62

(58) Field of Classification Search ................. 439/62, 439/79, 64, 950, 607–610; 361/737, 686; 235/492, 487
See application file for complete search history.

(56) References Cited

U.S. PATENT DOCUMENTS 4,843,226 A * 6/1989 Kato et al. .................. 235/492
5,936,841 A * 8/1999 Kantner et al. ............. 361/737
6,382,987 B1 * 5/2002 Yu .............................. 439/79

* cited by examiner

*Primary Examiner*—J. F. Duverne
(74) *Attorney, Agent, or Firm*—Troxell Law Office. PLLC

(57) ABSTRACT

A memory card structure according to the invention includes a memory card body having contact terminals. Each of the contact terminals is extended forward to form a conducting plate to an insertion section at a front end of the memory card body to form an L-shaped structure or an individual structure at the insertion section at the front end. When the memory card structure is connected with a connecting device such as a card reading device or a connector, the memory card body is inserted into the accessing device using the insertion section at the front end thereof, and becomes conducted with the accessing device through the conducting plates at the front end of the contact terminals, thereby reducing an overall volume of the connecting device.

4 Claims, 5 Drawing Sheets

MEMORY CARD STRUCTURE

BACKGROUND OF THE INVENTION (a) Field of the Invention

The invention relates to a memory card structure, and more particularly, to a memory card structure comprising contact terminals extended forward to form conducting plates. The conducting plates and the contacting terminals form L-shaped structures, or the conducting plates are individually provided at an insertion section at a front end of the memory card, thereby minimizing an overall thickness of an accessing device when conducting the conducting plates with the accessing device.

(b) Description of the Prior Art

Accompanied with advancement of technology and development of information, electronic products are continuously upgrading as well. Among electronic products, memory cards are distinguished as the currently most convenient information storage products. Memory cards are applied extensively in various fields of high-technology products such as digital static cameras and digital video cameras.

Memory cards are available in several types including SD, XD and MMC derived from different storage standards. Through external contact terminals, memory cards store information using internally disposed memories thereof, and forward information signals to a card reading device, with the information signals further accepted by a computer host.

Referring to FIGS. 1 and 2 showing a prior memory card and connection devices namely a card reading device and a connector, a memory card body 10' has contact terminals 20' corresponding with a connector 30'. When the memory card body 10' is inserted into the connector 30', the contact terminals 20' of the memory card body 10' are assembled in a stacked manner with a conducting plate 31' in the connector 31'. Thus, the memory card body 10' is enabled to read and store information by connecting the connector 30' as a connector with a reading device.

To more effectively connect the contact terminals 2 with the conducting plate 30', the conducting plate 31' in the connector 30' is devised as an elastic arched member, such that when the contact terminals 20' are more tightly joined with when stacked on the conducting plate 30' using the elasticity of the arched shaped thereof.

However, to accomplish connection of the contact terminals 20' with the conducting plate 30' in a stacked manner, it is necessary that an interior of the connector 30' be provided with an accommodating space 32' having a rather large thickness, so that the memory card body 10' is free from interference with the conducting plate 31' when inserting the memory card body 10' to smoothly assemble the memory card body 10' with the connector 30'. In other words, using the aforesaid prior structure, it is impossible that the connector 30' have a minimized thickness, and hence imposing restrictions on development of the connecting device.

SUMMARY OF THE INVENTION

Therefore, in the view of the aforesaid shortcomings of the prior invention, it is a vital task of the invention as to provide a novel memory card structure that overcomes the aforesaid shortcomings.

The primary object of the invention is to provide a memory card structure having conducting plates at a front end of contact terminals thereof. When assembling the memory card body with a connecting device, the conducting plates are conducted with conducting plates in the connecting device in a corresponding front-and-rear manner, thereby reducing an overall thickness of the connecting device.

To accomplish the aforesaid object, a memory card structure according to the invention includes a memory card body having contact terminals. Each of the contact terminals is extended forward to form a conducting plate to an insertion section at a front end of the memory card body, so as to form an L-shaped structure with the contact terminal. When the memory card structure is connected with a connecting device such as a card reading device or a connector, the memory card body is inserted into the accessing device using the insertion section at the front end thereof while forming L-shaped structures from the contact terminals and the conducting plates, and becomes conducted with the accessing device, thereby reducing an overall volume of the connecting device. The conducting plates can also be individually disposed at the insertion section at the front end to accomplish the same effects.

DETAILED DESCRIPTION OF THE PREFERRED EMBODIMENTS

To better understand contents and accomplished effects of the invention, detailed descriptions shall be given with the accompanying drawings below.

Figure 1:
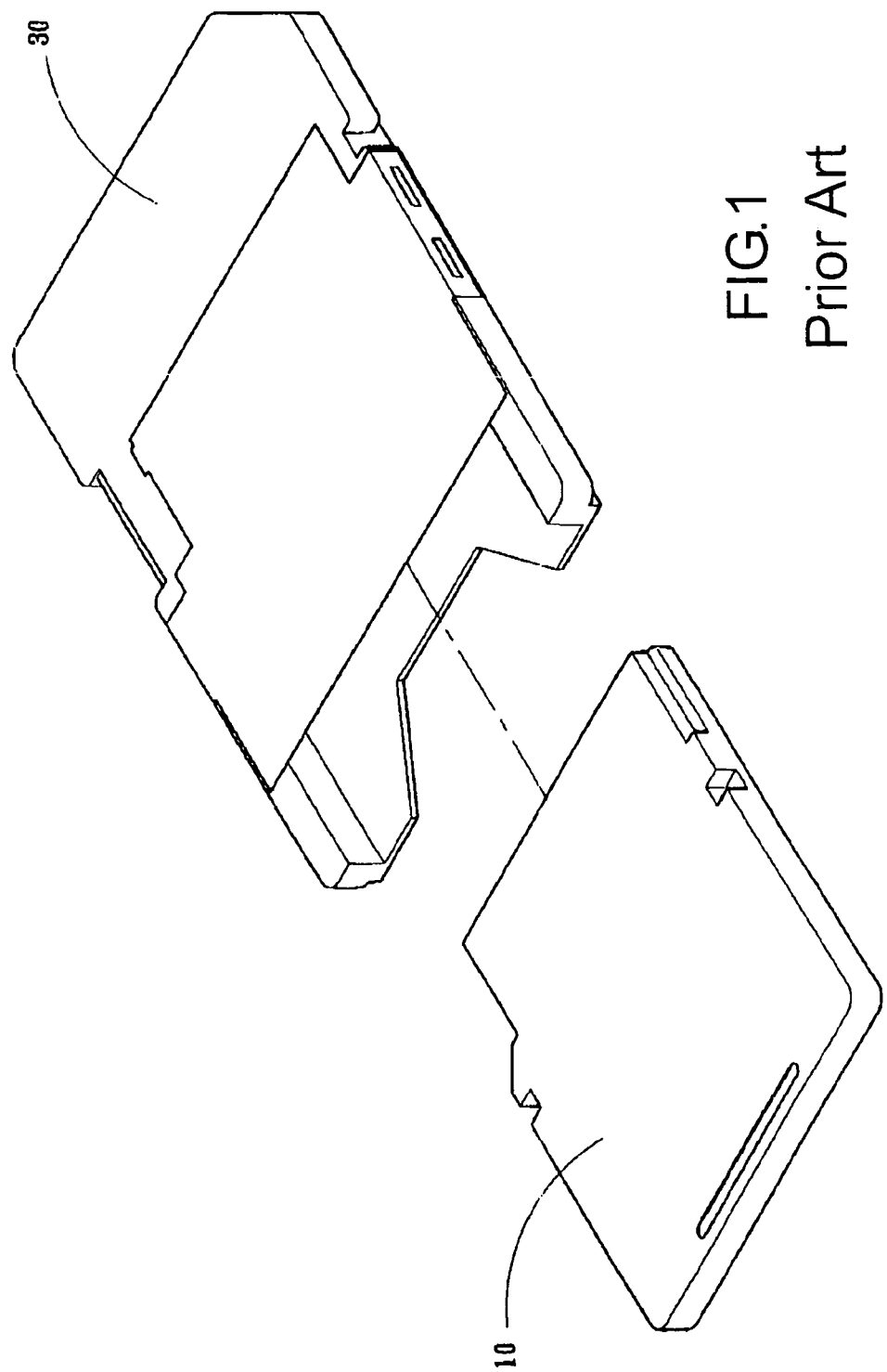
FIG. 1 shows a schematic view illustrating a prior memory card being connected with a connector.
Figure 2:
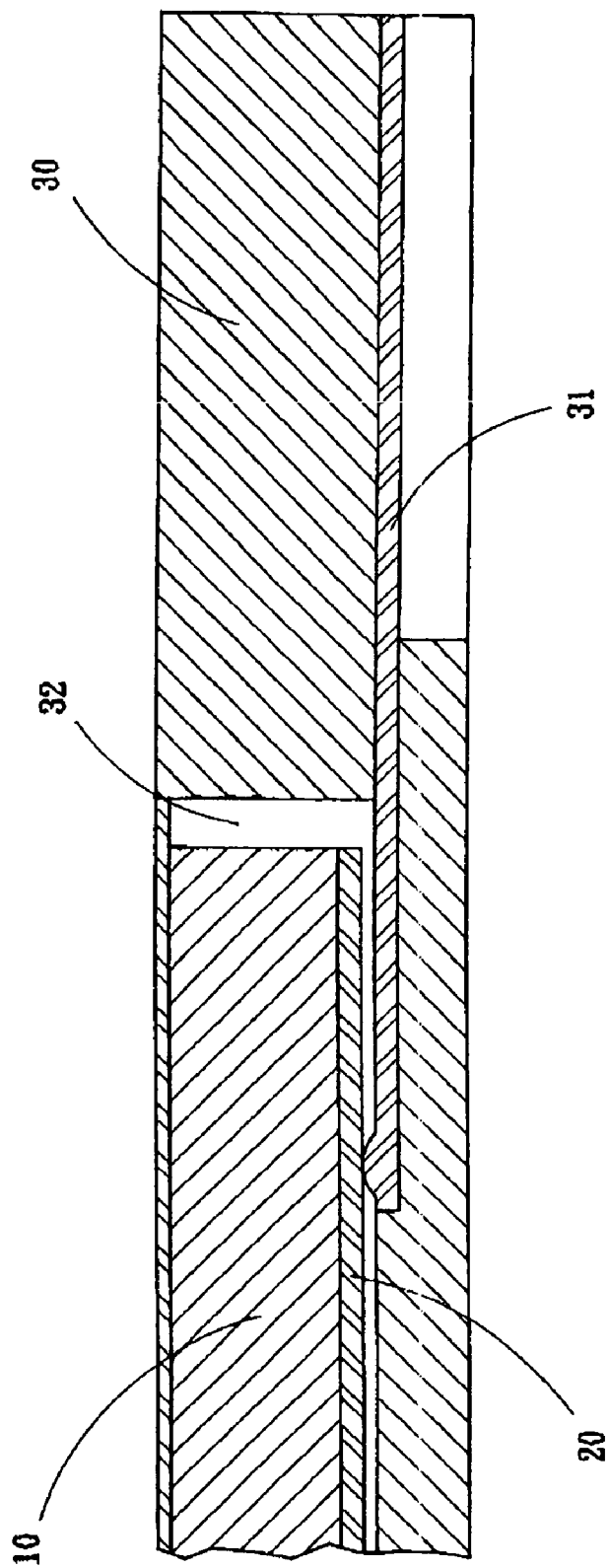
FIG. 2 shows a sectional schematic view illustrating a prior memory card having been connected with a connector.
Figure 3:
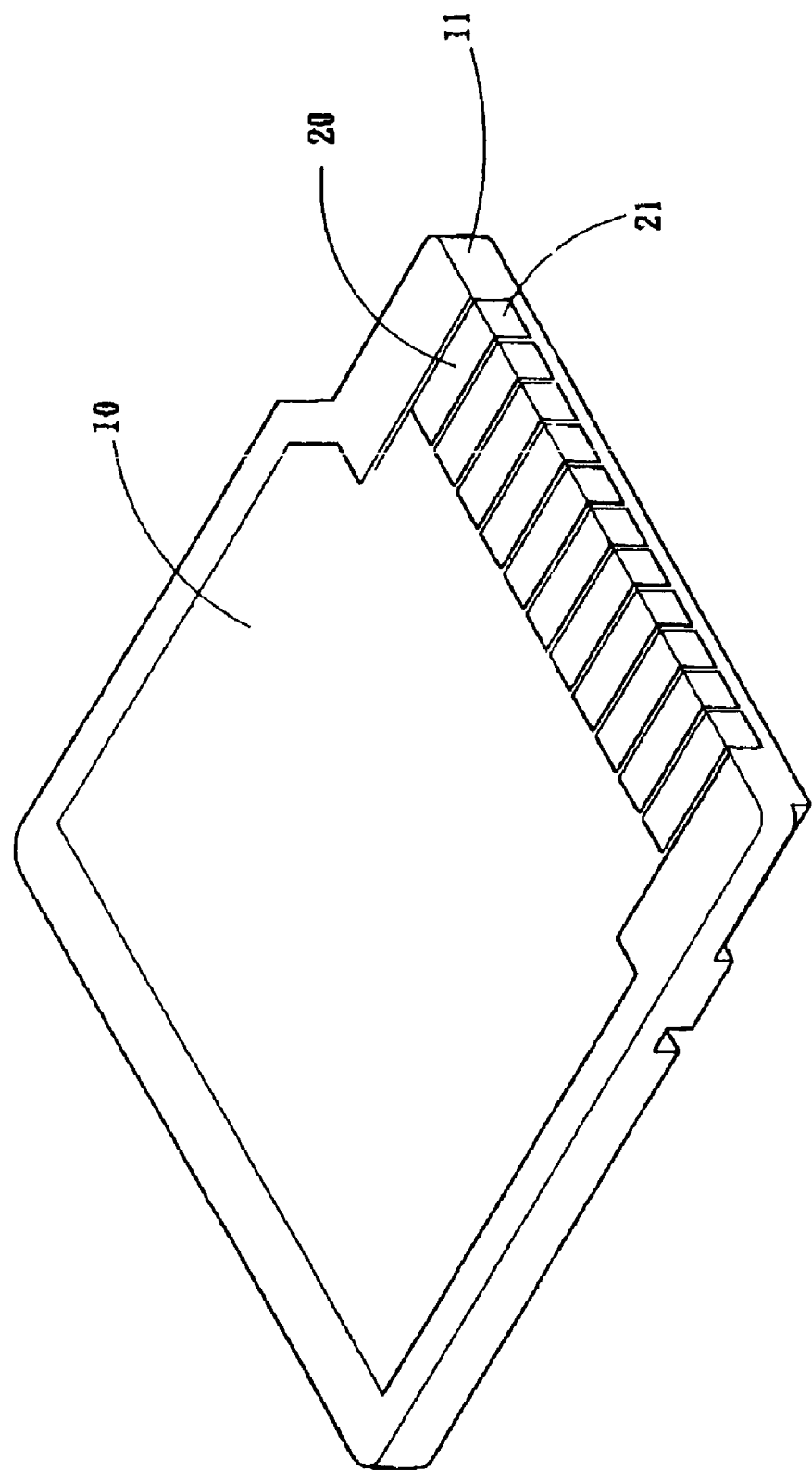
FIG. 3 shows a schematic view according to the invention.
Figure 4:
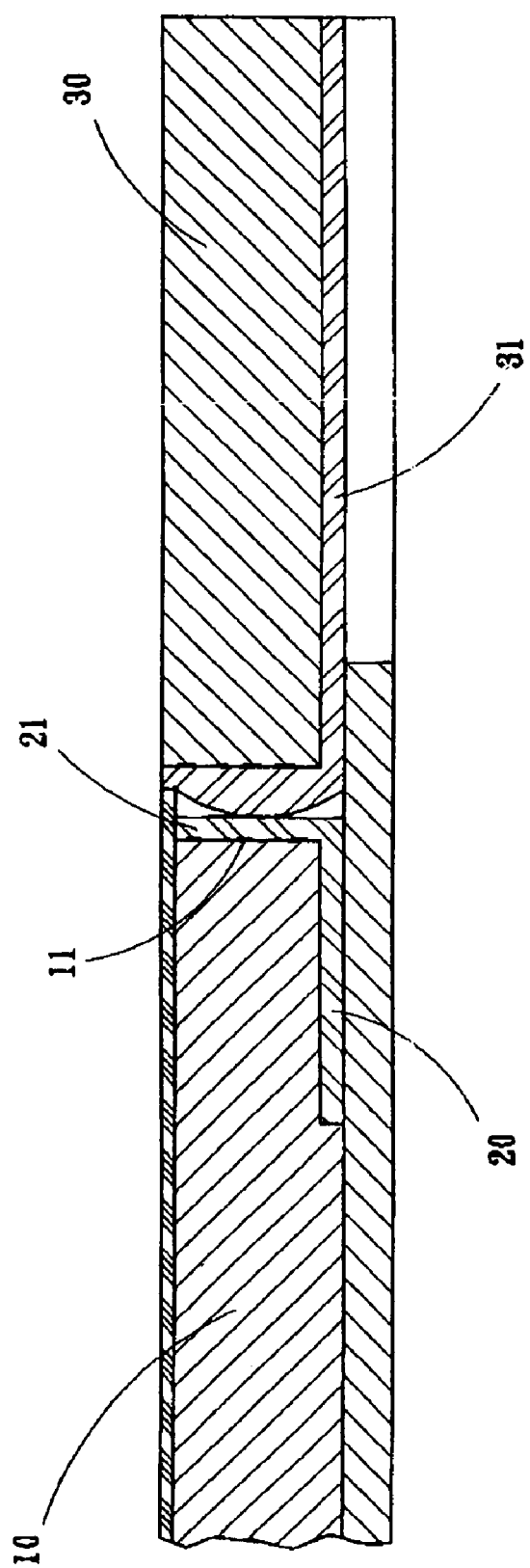
FIG. 4 shows a sectional schematic view according to the invention in application.

Referring to FIGS. 3 and 4, a memory card structure according to the invention comprises a memory card body 10 having contact terminals 20. Each of the contact terminals 20 is provided with a conducting plate 21 at a front end thereof to form an L shape with the contact terminal 20. The contact terminals 20 and the conducting plates 21 are made of an electrically conductive material. The conducting plates 21 are disposed at an insertion section 11 at a front end of the memory card body 10.

When the memory card body 10 is inserted within the connector 30, conducting plates 31 in the connector 30 also form an L-shaped structure. By inserting the insertion section 11 at the front end of the memory card body 10 in the connector 30, the conducting plates 21 at the insertion section 11 are conducted in a front-and-rear manner with the L-shaped conducting plates 31 in the connector 30. An end where the conducting plates 31 in the connector 30 are connected with the conducting plates 21 appears as an arched shaped with elasticity, thereby more tightly joining the conducting plates 21 with the conducting plates 31.

It is to be noted that, when assembling the memory card body 10 with the connector 30, by joining the conducting plates 21 at the front end of the contact terminals 20 with the L-shaped conducting plates 31 in the connector 30, the conducting plates 21 and the conducting plates 31 are conducted in a corresponding front-and-rear manner, thereby reducing an overall thickness of the connector 30 as well as minimizing the connector 30 for expanding development of the connector 30 as a connecting device.

Figure 5:
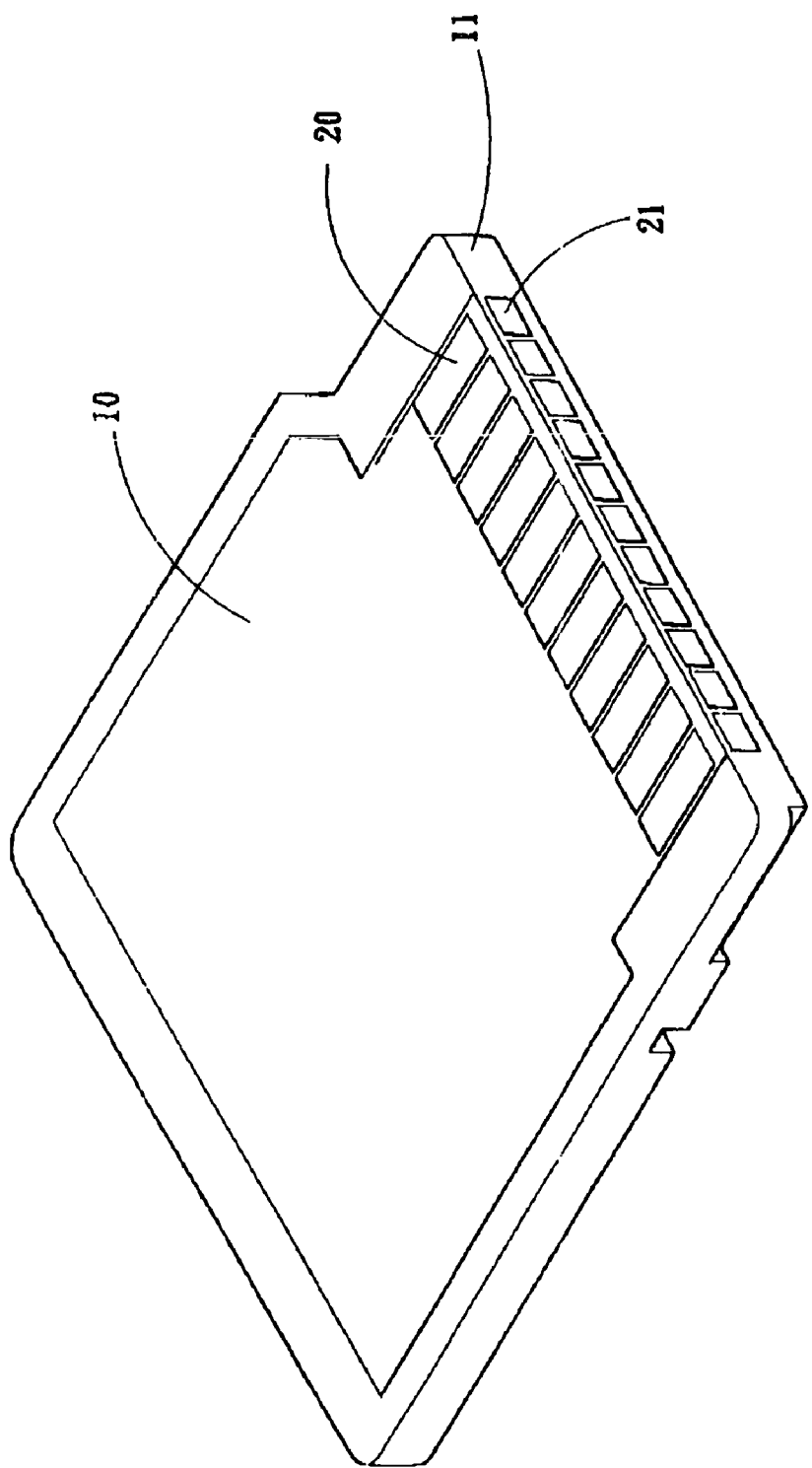
FIG. 5 shows a sectional schematic view of another embodiment according to the invention.

Referring to FIG. 5, the conducting plates 21 at the front end of the contact terminals 20 can also be provided in a protruding manner at the front end of the contact terminals 20, such that the contact terminals 20 and the conducting plates 21 can be disposed in a protruding manner at outer sections of an upper end of the memory card 10 and a front end of the insertion section 11 to display as disjoined while having same effects.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A memory card structure comprising:
a memory card body having a plurality of contact terminals located on an end of a top surface thereof, each of the plurality of contact terminals having a card body conducting plate located on an insertion section of the memory card body, the insertion section is located on a front end of the memory card body between the top surface and a bottom surface thereof, one card body conducting plate and each of the plurality of contact terminals forming an L-shaped cross section, each card body conducting plate having a length less than or equal to a thickness of the memory card body, and the thickness being a distance between the top surface and the bottom surface.

2. The memory card structure according to claim 1, further comprising a connector having a plurality of connector conducting plates, each of the plurality of connector conducting plates having an L-shaped cross section, one of the plurality of connector conducting plates engaging each card body conducting plate located on the front end of the memory card body.

3. The memory card structure according to claim 1, wherein each of the plurality of contact terminals are spaced apart.

4. The memory card structure according to claim 1, wherein each card body conducting plate extending along the insertion section toward the bottom surface of the memory card body.

* * * * *